(12) United States Patent
Nordquist et al.

(10) Patent No.: US 7,425,392 B2
(45) Date of Patent: Sep. 16, 2008

(54) LITHOGRAPHIC TEMPLATE AND METHOD OF FORMATION AND USE

(75) Inventors: Kevin J. Nordquist, Gold Canyon, AZ (US); Jeffrey H. Baker, Chandler, AZ (US); William J. Dauksher, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 426 days.

(21) Appl. No.: 11/213,071

(22) Filed: Aug. 26, 2005

(65) Prior Publication Data

US 2007/0048625 A1 Mar. 1, 2007

(51) Int. Cl.
  *G03F 1/00* (2006.01)
(52) U.S. Cl. .......................... 430/5; 430/311; 430/312; 430/313
(58) Field of Classification Search ....................... 430/5
  See application file for complete search history.

(56) References Cited

U.S. PATENT DOCUMENTS

| | | | |
|---|---|---|---|
| 5,024,889 A * | 6/1991 | Loszewski | 428/368 |
| 6,387,787 B1 | 5/2002 | Mancini et al. | |
| 6,458,650 B1 * | 10/2002 | Huang et al. | 438/253 |
| 6,580,172 B2 | 6/2003 | Mancini et al. | |
| 6,737,202 B2 | 5/2004 | Gehoski et al. | |
| 7,037,851 B2 * | 5/2006 | Gueneau de Mussy et al. | 438/739 |
| 7,063,919 B2 * | 6/2006 | Mancini et al. | 430/5 |
| 2002/0027286 A1 * | 3/2002 | Sundararajan et al. | 257/751 |
| 2004/0173910 A1 * | 9/2004 | Usami et al. | 257/762 |

OTHER PUBLICATIONS

Bharadwaj et al . (Oxidation Behavior of a Fully Dense Polymer-Derived Amorphous Silicon Carbonitride Ceramic; Journal of the American Ceramic Society 87 (3), 483-486).*
Wolf et al. (Silicon Processing for the VLSI Era; vol. 1; 1986; Lattice Press).*

* cited by examiner

*Primary Examiner*—Keith D. Hendricks
*Assistant Examiner*—Patricia A George

(57) ABSTRACT

A lithographic template, a method of forming the lithographic template and a method for forming devices with the lithographic template is provided. The lithographic template (10) and the method of making comprises forming a transparent conductive layer (16) over a substrate (12). A SiCN layer (18) is formed over the transparent conductive layer (16), and a patterning layer (20) formed on the SiCN layer (18). The SiCN layer (18) is converted to an $SiO_2$ layer by applying an $O_2$ plasma (23). The $SiO_2$ layer prevents damage to the transparent conductive layer (16) during cleaning and provides a binding mechanism for the imprint release coating.

6 Claims, 2 Drawing Sheets

LITHOGRAPHIC TEMPLATE AND METHOD OF FORMATION AND USE

FIELD OF THE INVENTION

The present invention generally relates to semiconductor devices, microelectronic devices, micro electro mechanical devices, microfluidic devices, photonic devices, and more particularly to a lithographic template, a method of forming the lithographic template and a method for forming semiconductor devices with the lithographic template.

BACKGROUND OF THE INVENTION

The fabrication of integrated circuits, microelectronic devices, micro electro mechanical devices, microfluidic devices, and photonic devices, involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL) has been shown to be capable of patterning lines as small as 20 nm.

SFIL templates are typically made by applying a layer of chrome, 10-100 nm thick, on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hardmask for the etching of the quartz plate. Finally, the chrome is removed, thereby forming a quartz template containing relief images in the quartz.

Overall, SFIL techniques benefit from their unique use of photochemistry, the use of ambient temperatures, and the low pressure that is required to carry out the SFIL process. During a typical SFIL process, a substrate is coated with an organic planarization layer and is brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or crosslinked, at room temperature by illuminating through the template. The light source typically uses ultraviolet radiation. A range of wavelengths (150 nm-500 nm) is possible, however, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen (or equivalent) reactive ion etch (RIE) to form a high-resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief image etched into its surface, creating a form or mold. A pattern is defined when a photocurable liquid flows into the relief image and is subsequently cured. The attributes necessary for masks and templates, therefore, are quite different.

SFIL technology has been demonstrated to resolve features as small as 20 nm. As such, a wide variety of feature sizes may be drawn on a single wafer. Certain problems exist though with this SFIL template fabrication methodology as described above. In particular, problems exist with respect to: (i) uniform etching of the quartz template when only a chrome hardmask is utilized; (ii) image distorting charging effects during electron beam patterning of the template; (iii) the effects of charging during scanning electron microscope inspection of the fabricated template; and (iv) the elimination of the detection of false defects during optical or e-beam defect inspection.

Of concern is the fact that quartz is very resistive and prone to charging during e-beam irradiation. Accordingly, there is a desire to include within the template fabrication a transparent conductive coating to eliminate this concern. The inclusion of a transparent conductive coating, or layer, will provide for the elimination of image distorting charging effects during electron beam patterning of the template, elimination of charging effects during scanning electron microscope inspection of the fabricated template, and service as an etch stop barrier layer during oxide patterning. The most convenient transparent conductive material is indium-tin-oxide (ITO), although many other transparent conductive materials providing these benefits can be used. Common deposition techniques for ITO involve heating the substrate to approximately 200° C. during the deposition process. Unfortunately, this produces films which are rough and grainy. This production of a rough and grainy conductive layer will not produce the desired results as described above.

With the inclusion of a conductive layer, charge build-up during electron-beam exposure is avoided. In addition, inspectability is achievable due to the template being comprised of multiple materials. Typical inspection systems use either light (ultraviolet or deep ultraviolet) or electrons to determine feature size and detect unwanted defects on the template. Light-based systems require a difference in reflection or index of refraction between patterned and unpatterned areas of the template to provide good image contrast. Likewise, an electron-based system requires a difference in atomic number between patterned and unpatterned areas of the template. To overcome this problem, multiple materials having either different optical properties or different atomic numbers would allow for inspection, a necessity for sub-100 nm features.

Furthermore, a conductive layer should not susceptible to damage during cleaning operations. The conductive layer should also freely disengage from release coatings during the imprinting process.

Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

This invention relates to semiconductor devices, microelectronic devices, micro electro mechanical devices, microfluidic devices, and more particularly to a lithographic template, a method of forming the lithographic template and a method for forming devices with the lithographic template. Disclosed is a lithographic template including a substrate, a transparent conductive layer, a $SiO_2$ layer formed from a SiCN layer, and an etched patterning layer. The lithographic template is formed by providing a transparent substrate and forming a transparent conductive layer on the substrate using low pressure sputtering techniques, thereby providing for a smooth layer having conductive properties sufficient to eliminate surface charging while maintaining transparency to ultraviolet light. A SiCN layer formed on the transparent conductive layer and subsequently converted to $SiO_2$ prevents damage to the transparent conductive layer during cleaning and provides a binding mechanism for the imprint release coating. The next steps in forming the lithographic template include, forming a patterning layer on the smooth SiCN layer, forming a patterned resist layer on the patterning layer, etching the patterning layer to expose portions of the smooth SiCN layer, removing the patterned resist layer to expose the etched patterning layer, thus defining a lithographic template. The lithographic template is then exposed to an $O_2$ plasma for converting the SiCN layer to a transparent $SiO_2$ layer. Additionally, disclosed is a method for making a device with the lithographic template as provided, including the steps of providing a substrate, coating the substrate with a photocurable liquid, providing a lithographic template as previously disclosed, positioning the lithographic template in contact with the photocurable liquid, applying pressure to the template so that a pattern is created in the photocurable liquid, transmitting radiation through the lithographic template to expose at least a portion of the photocurable material on the substrate, thereby further affecting the pattern in the photocurable liquid, and removing the template from the substrate.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The present invention relates to the prevention of inadvertent etching of the transparent conductive layer during cleaning processes and the prevention of release coatings from sticking to a template during the manufacture of semiconductor devices, for example. It is proposed that a quad-layer of materials be deposited on a substrate surface, thereby forming a lithographic template including these improvements.

Figure 1:
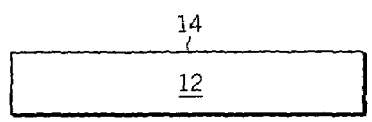
FIGS. 1-8 is a cross-section view of process steps for fabricating a lithographic template in accordance with an exemplary embodiment of the present invention.

Referring to FIGS. 1-8, illustrated in cross-sectional views, are a plurality of process steps for fabricating a lithographic template according to the present invention. Referring more specifically to FIG. 1, illustrated is a first step in the process of fabricating a lithographic template 10 according to the present invention. More specifically, illustrated is substrate 12, having a surface 14. Substrate 12 is disclosed as being comprised of a transparent material, such as a quartz material, a polycarbonate material, a Pyrex® material, a calcium fluoride ($CaF_2$) material, a magnesium fluoride material ($MgF_2$), or any other similar type of material, that is transparent to light. Substrate 12 is formed of a transparent material to allow for the passage therethrough of light.

Figure 2:
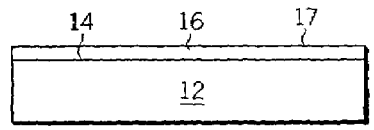

Referring now to FIG. 2, illustrated is substrate 12, having deposited thereon surface 14, a transparent conductive layer 16. Transparent conductive layer 16 is disclosed as being formed of a transparent material thereby providing for the subsequent passing therethrough of preferably 90% of light in the ultraviolet range. Various materials are proposed for fabrication of transparent conductive layer 16. It is disclosed that the specific type of material utilized will have bearing on the resulting process steps that must be undertaken to complete fabrication of template 10. Transparent materials that are disclosed as being suitable for the fabrication of transparent conductive layer 16 include zinc tin oxide ($Zn_2SnO_4$), zinc tin oxide ($ZnSnO_3$), zinc indium oxide ($Zn_2In_2O_5$), zinc oxide (ZnO), zinc oxide doped with aluminum (ZnO:Al), zinc oxide doped with fluorine (ZnO:F), zinc oxide doped with gallium, (ZnO:Ga), zinc oxide doped with boron (ZnO:B), zinc oxide doped with indium (ZnO:In), magnesium indium oxide ($MgIn_2O_4$), gallium indium oxide ($GaInO_3$), gallium indium oxide (($GaIn)_2O_3$), indium tin oxide ($In_4Sn_3O_{12}$), indium oxide doped with tin ($In_2O_3$:Sn), cadmium tin oxide ($Cd_2SnO_4$), tin oxide ($SnO_2$), tin oxide doped with fluorine ($SnO_2$:F), tin oxide doped with antimony ($SnO_2$:Sb), titanium nitride (TiN), tantalum nitride (TaN), or the like. Transparent conductive layer 16 is formed to assist with the elimination of image distorting charging effects that occur during electron beam patterning of the template, elimination of charging effects that occur during scanning electron microscope inspection of the fabricated template, elimination of false defects during optical and e-beam defect inspection, and to serve as an etch stop barrier during subsequent patterning of the remaining layers. Transparent conductive layer 16 is disclosed as having a thickness dependent upon the charge conductivity of the material used, the transmissive properties of the material used, and the etch selectivity to the patterning layer. It is disclosed that transparent conductive layer 16 is preferable formed as smooth as substrate surface 14 on which it is formed. More specifically, transparent conductive layer 16 is described as being formed: (i) extremely smooth (<1 nm rms, and preferably <0.3 nm rms); (ii) having the ability to transmit therethrough approximately 90% or greater ultraviolet light used during subsequent processing steps; and (iii) sufficiently conductive to eliminate surface charging. In addition, transparent conductive layer 16 must have sufficient strength to survive the stresses associated with template manufacturing and subsequent handling during the fabrication of the semiconductor devices with the completed lithographic template. In a preferred embodiment, transparent conductive layer 16 is formed of indium-tin-oxide (ITO).

Transparent conductive layer 16 is disclosed as having a thickness that is adjusted for maximum transmittance of radiation used to cure a subsequent resist layer (discussed presently) present within the template structure. Typically this thickness is in a range of 10-1000 nm, having a preferred thickness of approximately 80 nm, thereby able to transmit ultraviolet light, and more particularly light having a wavelength of 365 nm. Transparent conductive layer 16 is formed having a surface 17, on surface 14 of substrate 12 by sputtering. Deposition conditions which will yield a layer with the desired qualities for SFIL include: (i) low pressure sputtering, generally less than 20 mTorr, and preferably less than 3 mTorr; (ii) a low oxygen partial pressure, typically less than 2%; (iii) at a power of 100 Watts RF for a 100 cm diameter target; and (iv) a sputtering rate of 5-10 nm/min. During the sputtering of transparent conductive layer 16, no external heat is applied to substrate 12. Subsequent to the sputtering deposition of transparent conductive layer 16 onto substrate 12, transparent conductive layer 16 is annealed at approximately 350° C. (dependent upon material) for approximately one hour in an ambient air oven.

Transparent conductive layer 16 is formed of a material having a resistivity of below one kilo ohm-cm, and preferably below 1 ohm-cm. Fabrication of transparent conductive layer 16 as disclosed herein results in an ITO film having resistivity of less than 1 ohm-cm, as compared to 0.001 ohm-cm for many commercial ITO films. These commercial ITO films do not have the high transmittance at UV wavelengths required to cure the SFIL resist, and have an order of magnitude higher roughness, which is detrimental to nanometer scale lithography. Fabrication of transparent conductive layer 16 in this manner optimizes the UV transmittance and low surface roughness of the layer, while providing sufficient conductivity to eliminate charging during e-beam patterning or post fabrication SEM inspection. Commercial ITO processes optimize resistivity and transmittance in the visible portion of the spectrum.

Figure 3:
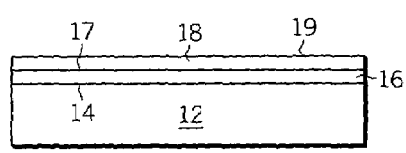

Referring to FIG. 3, a SiCN (Silicon Carbon Nitride) layer 18 is deposited on the surface 17. SiCN layer 18 is formed to serve as an etch stop during subsequent patterning of the remaining layers. SiCN layer 18 may have a thickness in the range of 10-50 nm, but preferably in the range of 20-30 nm. SiCN layer 18 is preferably formed as smooth as transparent conductive layer surface 17 on which it is formed. More specifically, SiCN layer 18 is described as being formed: (i) extremely smooth (<1 nm rms, and preferably <0.3 nm rms); (ii) upon conversion to $SiO_2$, transmit therethrough approximately 90% or greater ultraviolet light used during subsequent processing steps; (iii) having a sufficiently low etch rate relative to the patterning layer in order to overcome any microloading effects; and (iv) having a film comprising 60-65% carbon, 30-35% Si, and N enabling the ability to be converted into $SiO_2$ through exposure to an oxygen reactive ion plasma. In addition, SiCN layer 18 must have sufficient strength to survive the stresses associated with template manufacturing and subsequent handling during the fabrication of the semiconductor devices with the completed lithographic template.

SiCN layer 18 is disclosed as having a thickness that is adjusted after conversion into $SiO_2$ for maximum transmittance of radiation used to cure a subsequent resist layer (discussed presently) present within the template structure. Typically this thickness is in a range of 10-50 nm, having a preferred thickness of approximately 20 nm, thereby able to transmit ultraviolet light, and more particularly light having a wavelength of 365 nm. SiCN layer 18 is formed on surface 17 of transparent conductive layer 16 by plasma enhanced chemical vapor deposition (PECVD). Deposition conditions which will yield a layer with the desired qualities for SFIL include: (i) A chamber pressure of 1.5 Torr; (ii) high frequency (13.56 MHz) power of 0.5 watts and low frequency (250 kHz) power of 0.5 watts; and (iii) gas flow rates of: CH4-6.5 L/minute, SiH4-0.06 L/minute, and N2-0.5 L/minute.

SiCN layer 18 is formed of a material constituting 60-65% carbon (C), 30-35% silicon (Si) and the remainder consisting of nitrogen (N). Fabrication of SiCN layer 18 as disclosed herein results in a film having a refractive index of approximately 2.086 before exposure to an oxygen plasma and a refractive index of approximately 1.45 after exposure to an oxygen plasma and subsequent conversion to $SiO_2$.

Figure 4:
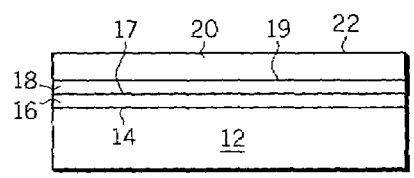

Referring now to FIG. 4, a patterning layer 20 is formed on surface 19 of SiCN layer 18. Patterning layer 20 is disclosed as being formed of either an opaque or transparent material, dependent upon overall design objective, as well as the material comprising transparent conductive layer 16. More specifically, it is disclosed that the specific type of material utilized will have bearing on the resulting process steps that must be undertaken to complete fabrication of template 10. Patterning layer 20 is generally disclosed as being formed of a material having a different reflectivity (or index of refraction) or different atomic number than the material used for transparent conductive layer 16. This difference in atomic number will provide for improved inspectability properties, as described presently. Transparent materials that are disclosed as being suitable for the fabrication of patterning layer 20 are silicon dioxide ($SiO_2$), silicon nitride (SiN), silicon oxy-nitride (SiON), indium-tin-oxide (ITO), or the like. Opaque materials that are disclosed as being suitable for the fabrication of patterning layer 20 are tungsten (W), tungsten silicide (WSi), tungsten silicon nitride (WSiN), tungsten alloys, tantalum (Ta), tantalum silicide (TaSi) or ($TaSi_x$), where 1<x<2, tantalum silicon nitride (TaSiN), tantalum alloys, titanium (Ti), titanium alloys, molybdenum (Mo), molybdenum silicide (MoSi) or ($MoSi_x$), where 1<x<2, molybdenum alloys, gold (Au), chrome (Cr), or the like. Patterning layer 20 may be used to assist charge dissipation during e-beam writing. In addition, patterning layer 20 aids in SEM-based template inspection due to the varying materials utilized in the plurality of layers. Patterning layer 20 is disclosed as generally having a thickness dependent upon the desired aspect ratio of the photocurable resist. Specifically, patterning layer 20 will need to have sufficient mechanical strength and durability to survive the stresses associated with template manufacturing and subsequent handling during the fabrication of the semiconductor devices with the completed lithographic template. Patterning layer 20 is therefore generally disclosed as having a thickness of between 10 and 5000 nm, and a preferred thickness of at least 50 nm. Patterning layer 20, having a surface 22, is formed on surface 19 of SiCN layer 18 by spin coating, sputtering, vapor deposition, or the like.

Figure 5:
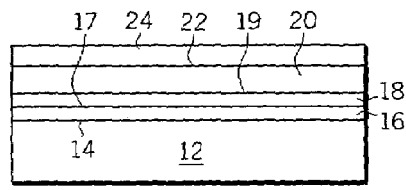
Figure 6:
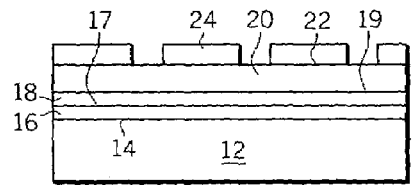

Referring now to FIGS. 5 and 6, a resist layer 24 is formed on the surface 22 of patterning layer 20, which is patterned as illustrated in FIG. 6 by standard optical or e-beam patterning techniques. Resist layer 24 is typically formed of a standard photoresist or electron-beam resist material well know in the art such as an organic polymer that is patterned so as to serve as a mask for the subsequent etching of patterning layer 20. It is additionally disclosed that anticipated by this disclosure is the optional inclusion of a hardmask layer (not shown), sandwiched between patterning layer 20 and resist layer 24. In the instance where a hardmask layer is included, it is anticipated that it would be formed of chrome (Cr), silicon dioxide ($SiO_2$), silicon oxy-nitride (SiON), silicon nitride (SiN), or the like.

Figure 7:
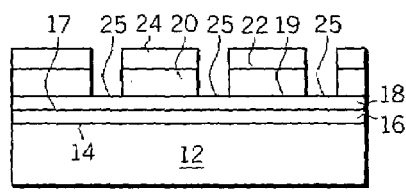
Figure 8:
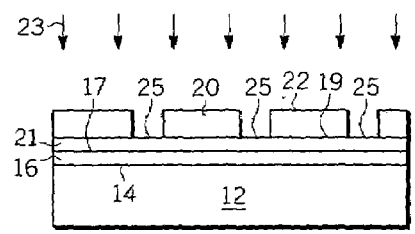

During fabrication, photoresist layer 24 serves as a mask for the etching therethrough of patterning layer 20. As illustrated in FIG. 7, patterning layer 20 is etched through to surface 19 of SiCN layer 18, thereby exposing portions 25 of SiCN layer 18. Etching of patterning layer 20 is accomplished through standard wet or dry etch techniques. Next, patterning layer 20 is overetched, if required, to provide for improved uniformity stopping against SiCN layer 18. Finally, to complete template 10, resist layer 24 is removed and the device is subjected to an oxygen ($O_2$) plasma 23 that converts the SiCN layer 18 to a silicon dioxide ($SiO_2$) layer 21 by providing reactive atomic oxygen in an elevated temperature (100-150C) environment (FIG. 8). The presence of $SiO_2$ layer 21 prevents the etching of the transparent conductive layer 16 during subsequent cleaning processes, and further provides a binding layer for release coatings (not shown) used during the fabrication of patterns in integrated circuits. The SiCN layer 18 converted to $SiO_2$ layer 21 prevents etch damage to the transparent conductive layer 16 during template cleaning and provides a binding mechanism for the imprint release coating.

FIG. 8 illustrates in cross-sectional view, a completed lithographic template 10 including substrate 12 having surface 14, transparent conductive layer 16 overlying surface 14 of substrate 12, transparent conductive layer 16 having a surface 17, $SiO_2$ layer 21 and patterning layer 20 overlying $SiO_2$ layer 21. Upon completion, template 10 defines therein a relief image (not shown).

In addition, while it is disclosed herein that template 10 is a single tiered structure, it is anticipated by this disclosure that template 10 can be formed as a multi-tiered structure having a transparent conductive layer present therein. Further information on the fabrication of a multi-tiered lithographic template can be found in U.S. Pat. No. 6,737,202, filed Feb. 22, 2002, entitled "METHOD OF FABRICATING A TIERED STRUCTURE USING A MULTI-LAYERED RESIST STACK AND USE", incorporated herein by this reference.

Figure 9:
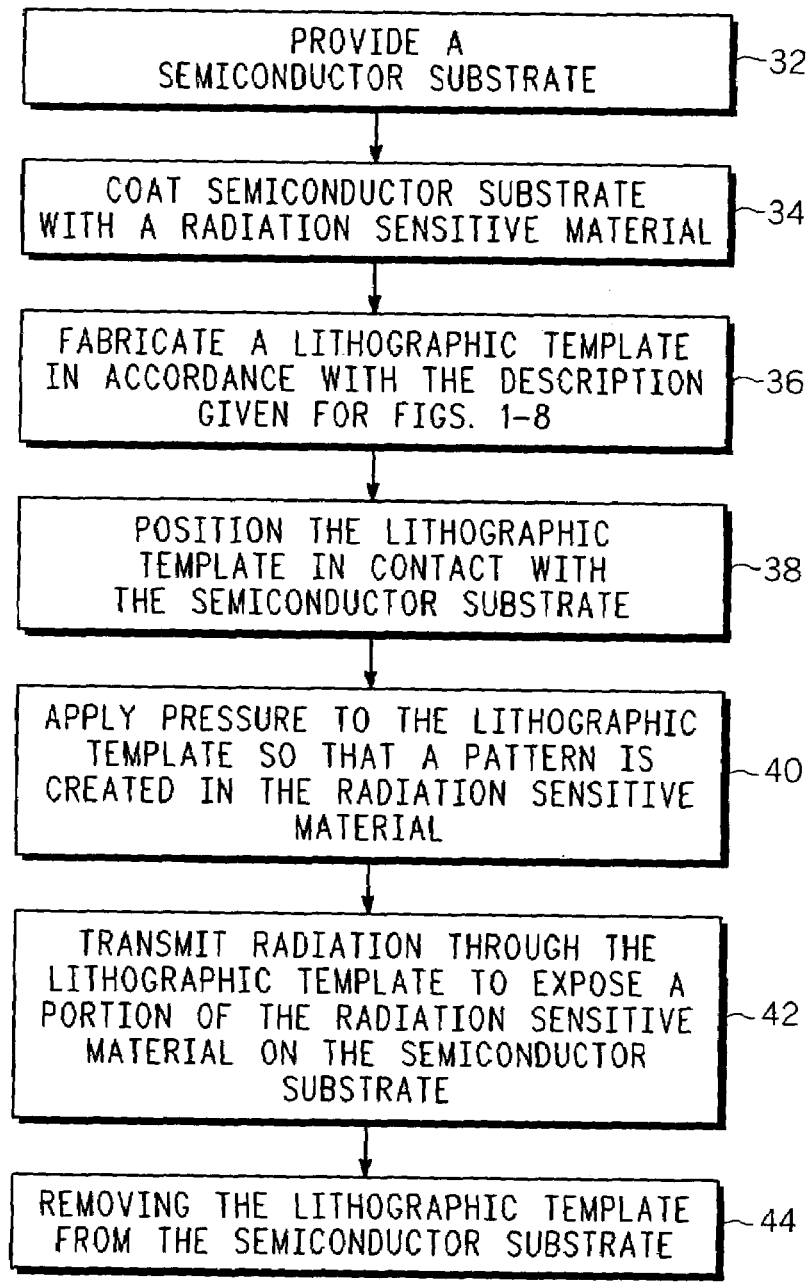
FIG. 9 is a simplified process flow diagram fabricating a semiconductor device with a lithographic template in accordance with the exemplary embodiment of the present invention.

Shown in FIG. 9 is a process flow diagram wherein a lithographic template, generally similar to template 10 of FIGS. 1-8, fabricated in accordance with the present invention is used to fabricate a semiconductor device 30. Initially, a semiconductor substrate 32 is provided. Semiconductor substrate is then coated 34 with a radiation sensitive material, such as a photocurable organic layer or a photoresist layer. The semiconductor substrate may have overlying devices or device layer such as polysilicon, oxide, metal, etc., as well as trench and diffusion regions or the like. A lithographic template is fabricated 36 in accordance with the description given for FIGS. 1-8. The radiation sensitive material layer coated semiconductor substrate is then placed adjacent 38 the lithographic template. A slight pressure is applied 40 to the template so that the radiation sensitive material layer flows into the relief images on the template. Radiation is then transmitted 42 through the lithographic template, including the substrate, the transparent conductive layer, the SiCN layer and the patterning layer (for the cases when the patterning layer is transparent), and imaged onto the radiation sensitive material layer coated semiconductor substrate to further define and expose a pattern in the radiation sensitive material layer. The template is thereafter removed 44 from the semiconductor device, thereby leaving a patterned organic layer which is then used as an image layer for subsequent processing. The photoresist layer can then be used as a mask, either in conjunction with ion implantation to form implanted regions in the semiconductor substrate, or can be used in conjunction with conventional wet or dry etches to transfer the pattern into the semiconductor substrate, or into device layers overlying the semiconductor substrate. It should be understood that although the template fabricated in accordance with the present invention is described in the preferred embodiment as being used to fabricate a semiconductor device, that anticipated is the use of a template, generally similar to template 10 of FIG. 8, to form microelectronic devices, micro electro mechanical devices, photonic devices and microfluidic devices.

The foregoing description and illustrations contained herein demonstrate many of the advantages associated with the present invention. In particular, the present invention provides the prevention of inadvertent etching of the transparent conductive layer during the template cleaning processes and provides a binding mechanism for the imprint release coating to a template during the manufacture of semiconductor devices, for example.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for forming a lithographic template comprising the steps of: providing a transparent substrate, the substrate having a surface; forming a transparent conductive layer on the surface of the transparent substrate; forming a SiCN layer on the surface of the transparent conductive layer; forming a patterning layer on a surface of the SiCN layer; forming a patterned resist layer on the surface of the patterning layer; etching the patterning layer, thereby defining an etched patterning layer; removing the patterned resist layer; and converting the SiCN to a transparent SiO2 layer having a thickness of about 20 nm for maximum transmittance of radiation at 365 nm to cure the patterned resist layer.

2. A method for forming a lithographic template as claimed in claim 1 wherein the step of forming a SiCN layer includes using PECVD to form the transparent conductive layer.

3. A method of forming a lithographic template as claimed in claim 2 wherein the step of forming a SiCN layer includes a chamber pressure of 1.5 Torr, 13.56 MHz power of 0.5 watts and 250 kHz power of 0.5 watts, and gas flow rates of: CH4-6.5 L/minute, SiH4-0.06 L/minute, N2-0.5 L/minute.

4. A method for forming a lithographic template as claimed in claim 1 wherein the step of converting a SiCN layer to a SiO2 layer includes forming a transparent layer that is at least 90% transmissive to ultraviolet light.

5. A method of forming a lithographic template as claimed in claim 1 wherein the step of forming a SiCN layer includes forming a SiCN layer having a film comprising 60-65% atomic weight carbon, 30-35% atomic weight Si, and N.

6. A method for forming a lithographic template as claimed in claim 1, wherein the converting step comprises applying an $O_2$ plasma.

* * * * *